United States Patent [19]
Fujikami et al.

[11] Patent Number: 5,932,523
[45] Date of Patent: Aug. 3, 1999

[54] SUPERCONDUCTING CABLE CONDUCTOR

[75] Inventors: Jun Fujikami; Nobuhiro Shibuta; Kenichi Sato, all of Osaka; Tsukushi Hara; Hideo Ishii, both of Yokohama, all of Japan

[73] Assignees: Sumitomo Electric Industries, Ltd.; The Tokyo Electric Power Company, Incorporated, both of Japan

[21] Appl. No.: 08/326,298

[22] Filed: Oct. 19, 1994

[30] Foreign Application Priority Data

Oct. 21, 1993 [JP] Japan .................................. 5-263382
Oct. 14, 1994 [JP] Japan .................................. 6-249279

[51] Int. Cl.$^6$ ............................ H01B 12/12; H01L 39/14
[52] U.S. Cl. .......................... 505/231; 505/230; 505/232; 174/125.1
[58] Field of Search .................... 174/125.1, 15.4, 174/15.5; 505/230, 231, 886, 232, 233, 234, 887, 884, 885

[56] References Cited

U.S. PATENT DOCUMENTS

| | | | |
|---|---|---|---|
| 3,644,988 | 2/1972 | Anderson | 29/599 |
| 4,437,080 | 3/1984 | Ekin et al. | 174/125.1 X |
| 4,883,922 | 11/1989 | Yokota et al. | 174/125.1 |
| 5,318,948 | 6/1994 | Okada et al. | 505/230 |

FOREIGN PATENT DOCUMENTS

| | | | |
|---|---|---|---|
| 0 412 527 A2 | 2/1991 | European Pat. Off. | |
| 0 449 316 A1 | 10/1991 | European Pat. Off. | |
| 0 503 525 | 9/1992 | European Pat. Off. | |
| 0 503 525 A1 | 9/1992 | European Pat. Off. | |
| 1 814 036 | 9/1969 | Germany. | |
| 1 665 721 | 12/1970 | Germany. | |
| 17 64 268 | 6/1971 | Germany. | |
| 2 040 298 | 3/1972 | Germany. | |
| 38 11 051 C2 | 10/1989 | Germany. | |
| 39 28 085 A1 | 2/1991 | Germany. | |
| 1-204311 | 8/1989 | Japan | 174/125.1 |
| 4-6713 | 1/1992 | Japan | 174/125.1 |
| 4-277410 | 10/1992 | Japan | 174/125.1 |
| 5-144333 | 6/1993 | Japan. | |
| 6-36329 | 5/1994 | Japan. | |
| 6-203655 | 7/1994 | Japan | 505/886 |

OTHER PUBLICATIONS

E.B. Forsyth, "Energy Loss Mechanisms of Superconductors Used in Alternating–Current Power Transmission Systems", Science, vol. 242, Oct. 21, 1988, pp. 391–399.
"Patent Abstracts of Japan", vol. 017, No. 307 (E–1379), Jun. 11, 1993 and JP–A–05 028847 (Furukawa Electric Co. Ltd: The; Others:01) Feb. 5, 1993.
"Patent Abstracts of Japan", vol. 017 No. 525 (E–1436), Sep. 21, 1993 and JP–A–05 144333 (Furukawa Electric Co. Ltd: The; Others:01) Jun. 11, 1993.
"Patent Abstracts of Japan", vol. 017 No. 525 (E–1436), Sep. 21, 1993 and JP–A–05 144332 (Furukawa Electric Co. Ltd: The; Others:01) Jun. 11, 1993.
"Patent Abstracts of Japan", vol. 018 No. 155 (E–1524), Mar. 15, 1994 and JP–A–05 334921 (Furukawa Electric Co. Ltd: The) Dec. 17, 1993.

*Primary Examiner*—Hyung-Sub Sough
*Attorney, Agent, or Firm*—Pennie & Edmonds LLP

[57] ABSTRACT

In order to provide a flexible oxide superconducting cable conductor which is reduced in ac loss, tape-shaped multifilamentary superconducting wires covered with a stabilizing metal are spirally wound on a flexible former. Each of the multifilamentary superconducting wires has a plurality of filaments. The filament contains an oxide superconductor. The superconducting wires are preferably wound on the former at a bending strain of not more than 0.3 %. In winding on the former, a prescribed number of tape-shaped multifilamentary superconducting wires are wound on a core member in a side-by-side manner, to form a first layer. Then, an insulating layer is provided on the first layer. This insulating layer can be formed by an insulating tape. A prescribed number of tape-shaped superconducting multifilamentary wires are wound on the insulating layer in a side-by-side manner, to form a second layer. The insulating layer is adapted to reduce ac loss of the conductors. When the former is made of a metal, it is more preferable to provide an insulating layer between the former and the multifilamentary superconducting wires.

10 Claims, 10 Drawing Sheets

SUPERCONDUCTING CABLE CONDUCTOR

BACKGROUND OF THE INVENTION

1. Field of the Invention

The present invention relates to a superconducting cable conductor employing an oxide superconductor, and more particularly, it relates to a flexible conductor which is applicable to a superconducting cable.

2. Description of the Background Art

An oxide superconductor which enters a superconducting state at the liquid nitrogen temperature is expected for application to a superconducting cable with a cooling medium of liquid nitrogen. When such application is implemented, it will be possible to simultaneously attain simplification of a thermal protection system and reduction of a cooling cost in relation to a metal superconducting cable which requires high-priced liquid helium at present.

A superconducting cable must be capable of transmitting a heavy current with low energy loss in a compact conductor. Power transmission is generally made through an alternating current, and a superconductor employed under an alternating current is inevitably accompanied by energy loss which is generically called ac loss. The ac loss such as hysteresis loss, coupling loss or eddy current loss depends on the critical current density (Jc) of the superconductor, sizes of filaments, the structure of the conductor, and the like.

Various types of superconducting cables have heretofore been manufactured through metal superconductors, with study of structures for reducing ac loss. For example, Japanese Patent Publication No. 6-36329 (1994) discloses a superconducting conductor which comprises a normal conductor, and composite multifilamentary superconductors which are spirally wound along the outer periphery of the normal conductor. The conductor disclosed in this gazette is formed by clockwisely and anticlockwisely wound layers of the composite multifilamentary superconductors, which are alternately superposed with each other. The directions for winding the conductors are varied every layer for reducing magnetic fields generated in the conductors, thereby reducing impedance and increasing current carrying capacity thereof. This gazette also proposes provision of a high-resistance or insulating layer between the layers, in order to reduce ac loss.

When a cable conductor is formed by an oxide superconductor, a technique employed in a metal superconductor cannot be applied as such. An oxide superconductor, i.e., a ceramics superconductor, is fragile and weak against mechanical strain as compared with a metal superconductor. For example, Japanese Patent Publication No. 6-36329 (1994) discloses a technique of spirally winding the superconductors around the normal conductor so that the winding pitch is equal to the diameter of each superconductor. However, when a recently developed superconducting wire comprising an oxide superconductor which is covered with a silver sheath is wound at such a short pitch, for example, there is a high possibility that the oxide superconductor is broken to disable current feeding. When an oxide superconducting wire is extremely bent, its critical current may be remarkably reduced. In manufacturing of a cable conductor, therefore, an important subject is how to arrange the oxide superconductor.

Further, the cable conductor must be flexible to some extent, for facilitating handling. It is also an important subject how to manufacture a flexible cable conductor through a hard and fragile oxide superconductor.

In addition, ac loss inevitably follows a superconductor which is employed under an alternating current, as described above. Thus, it also remains as an important subject how to reduce ac loss in manufacturing of a cable conductor through an oxide superconducting wire.

SUMMARY OF THE INVENTION

An object of the present invention is to provide a superconducting cable conductor having flexibility and exhibiting excellent superconductivity, particularly a high critical current and a high critical current density, through an oxide superconductor.

Another object of the present invention is to provide a superconducting cable conductor which is further reduced in ac loss through an oxide superconducting wire.

According to the present invention, provided is a superconducting cable conductor employing an oxide superconductor, which comprises a long flexible core member, a plurality of tape-shaped multifilamentary oxide superconducting wires which are spirally wound on the core member, and an electric insulating layer. In the inventive conductor, each of the tape-shaped multifilamentary oxide superconducting wires includes a plurality of filaments consisting essentially of an oxide superconductor, and a stabilizing metal covering the same. The plurality of tape-shaped superconducting wires wound on the core member form a plurality of layers, each of which is formed by winding a plurality of tape-shaped superconducting wires in a side-by-side manner. The plurality of layers are successively stacked on the core member. The electric insulating layer is at least provided between the plurality of layers. This core member provides the inventive superconducting cable conductor with flexibility. The superconducting cable conductor according to the present invention can maintain a superconducting state at the liquid nitrogen temperature.

The conductor according to the present invention is applicable to an ac conductor which is reduced in ac loss.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
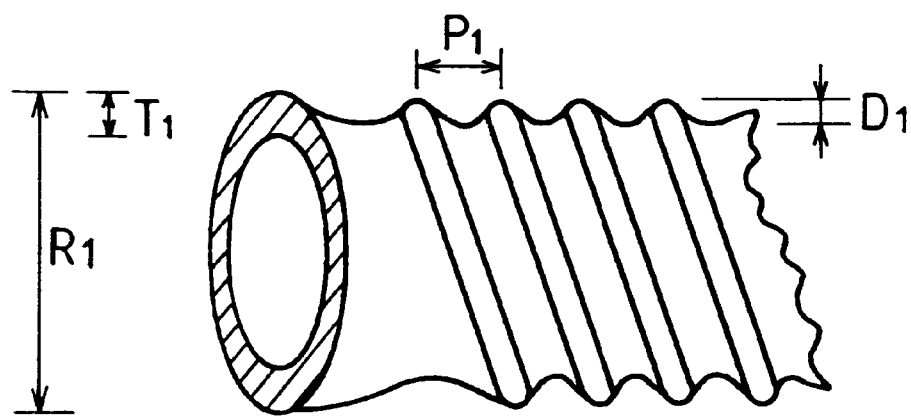
FIG. 1 partially illustrates a core member having spiral grooves employed in the present invention.

According to the present invention, each tape-shaped multifilamentary oxide superconducting wire generally has such a structure that a number of filaments consisting essentially of an oxide superconductor are buried in a stabilizing material of silver or a silver alloy. The oxide superconductor may be prepared from yttrium, bismuth or thallium based oxide superconductor such as $Y_1Ba_2Cu_3O_{7-X}$ ($0 \leq X < 1$), $(Bi,Pb)_2Sr_2Ca_2Cu_3O_{10-Y}$ ($0 \leq Y < 1$) or $Tl_2Sr_2Ca_2Cu_3O_{10-Z}$ ($0 \leq Z < 1$), for example. A bismuth based ceramics superconductor is preferable in consideration of a high critical temperature, a high current density, low toxicity and easiness in formation of a wire. A tape-shaped superconducting wire is generally manufactured through steps of preparing raw material powder for an oxide superconductor, charging the powder in a stabilizing material sheath, performing plastic working, and performing sintering. In the step of preparing raw material powder, powder materials of oxides or carbonates of elements for forming a superconductor are mixed with each other at prescribed blending ratios and sintered, so that the sintered mixture is thereafter crushed to obtain raw material powder. The powder is charged in a sheath which consists essentially of silver or a silver alloy, for example. The plastic working step is carried out through drawing and rolling, for example. After the rolling, the wire which is shaped into a tape is sintered at a temperature of about 800° C. to about 900° C., preferably at about 840° C. to 850° C., so that the superconductor provided in the sheath attains high orientation and a high critical current density. In order to prepare a multifilamentary wire, a plurality of wires obtained after drawing are assembled with each other and subjected to plastic working and sintering. In the aforementioned process, it is possible to form a substantially single superconducting phase having high orientation through combination of the plastic working and the sintering. Filaments of the tape-shaped superconducting wire prepared through the aforementioned process have substantially homogeneous superconducting phases along the longitudinal direction of the tape wire, while c-axes of the superconducting phases are oriented substantially in parallel with the direction of thickness of the tape wire. The filaments are formed by crystal grains in the form of flakes extending along the longitudinal direction of the tape wire, which are strongly bonded with each other. The flaky crystal grains are stacked along the direction of thickness of the tape wire. The tape-shaped superconducting wire as employed is not particularly restricted in size, but the same has a width of 1.0 mm to 10 mm, preferably 2 mm to 6 mm, and a thickness of 0.05 mm to 1 mm, preferably 0.1 mm to 0.4 mm, for example. In such sizes, the tape wire having filaments of the aforementioned structure can maintain a critical current density of $4 \times 10^3$ to $3.0 \times 10^4$ A/cm², for example. The tape wire having the filaments of the aforementioned structure is relatively resistant against bending, and maintains a high critical current density also when the same is held at a bending strain of a specific range, as described later. The tape-shaped multifilamentary superconducting wire can be provided with 7 to 10,000, preferably 37 to 1,000 filaments.

In the inventive conductor, the core member, which is generally called a former, is adapted to hold the tape-shaped superconducting wires at a bending strain of the prescribed range. This former has a length which is required for the superconducting cable conductor, and is provided at the center of the superconducting cable conductor. The former is in a substantially cylindrical or spiral shape so that the tape wires are wound thereon, and generally has a substantially constant diameter along its overall length. The former can consist essentially of at least one material selected from the group consisting of stainless steel, copper, aluminum and FRP (fiber-reinforced plastic), for example.

Figure 2:
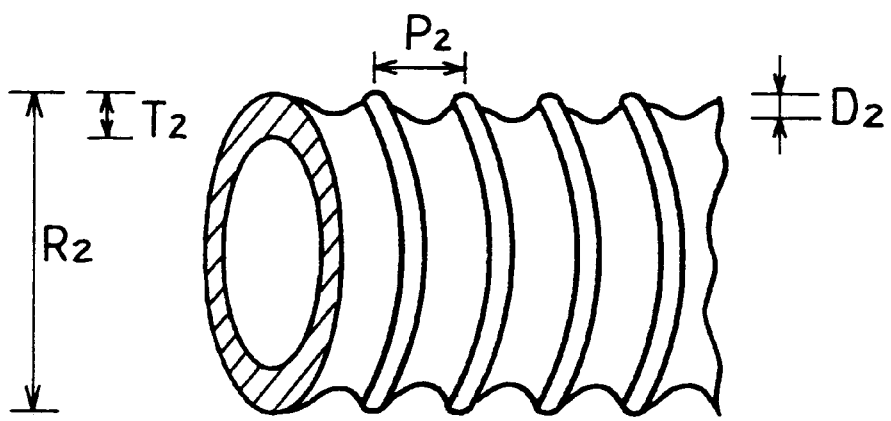
FIG. 2 is a perspective view partially showing a bellows tube type core member employed in the present invention.
Figure 3:
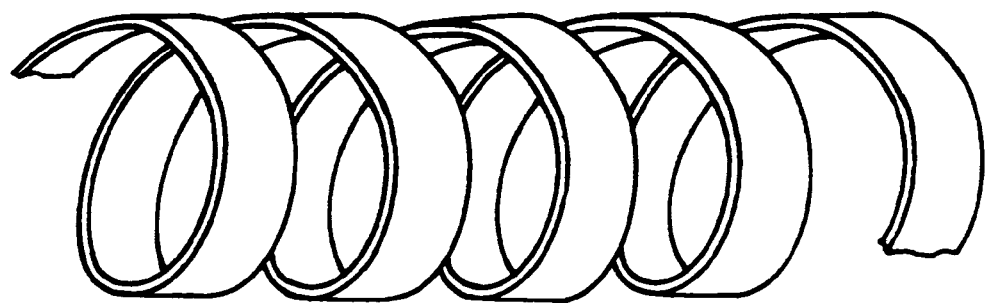
FIG. 3 is a perspective view showing the shape of a spiral strip core member employed in the present invention.

According to the present invention, the former is preferably in the form of a tubular member having flexibility. It is possible to preferably employ a pipe having a spiral groove (hereinafter referred to as a spiral tube) as a former having sufficient strength and flexibility, as shown in FIG. 1, for example. A bellows tube having a bellows is also preferably employed as a former as shown in FIG. 2. Referring to FIGS. 1 and 2, symbols $R_1$ and $R_2$ denote outer diameters, symbols $T_1$ and $T_2$ denote thicknesses, symbols $P_1$ and $P_2$ denote pitches, and symbols $D_1$ and $D_2$ denote gaps respectively. Further, the former can also be prepared from a spirally wound material such as that called a spiral steel strip shown in FIG. 3, for example. Each of these shapes is adapted to provide the former with sufficient flexibility. The spiral tube or the bellows tube can also be prepared from stainless steel, copper, aluminum or FRP. The flexible former provides the inventive conductor with flexibility. The flexible conductor can be taken up on a drum.

According to the present invention, it is possible to wind several 10 to 1,000 tape-shaped multifilamentary superconducting wires on the former. The tape wires are wound in at least two or more layers while directing principle surfaces thereof to the former. Each layer may be formed by an arbitrary number of the tape wires. When several 10 tape wires are wound on the former in parallel with each other so that the surface of the former is filled up with the tape wires, additional several 10 tape wires are further wound thereon. When a sufficient number of tape wires are wound on the first layer of the tape wires as a second layer, a third layer of tape wires are then wound thereon. The insulating layer is provided between each adjacent pair of layers.

Figure 4:
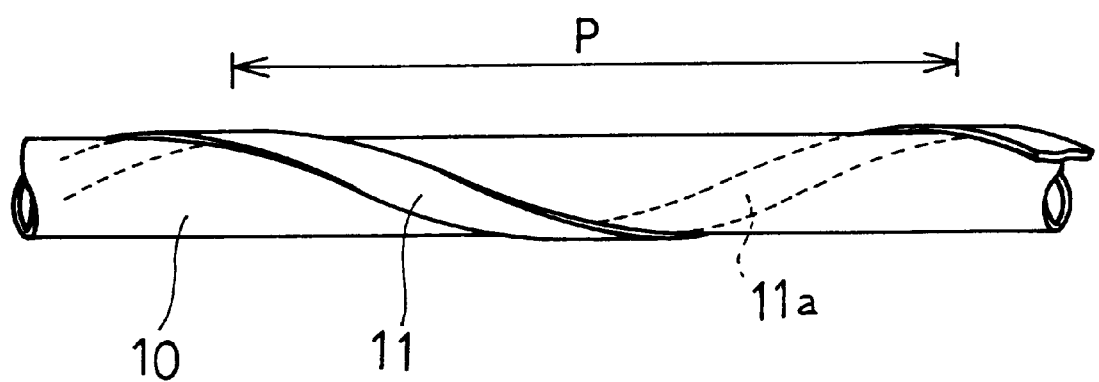
FIG. 4 typically illustrates a tape-shaped multifilamentary oxide superconducting wire spirally wound on a core member.

According to the present invention, each tape-shaped multifilamentary oxide superconducting wire is wound on a former as shown in FIG. 4, for example. Referring to FIG. 4, a tape wire 11 is wound on a former 10 having a prescribed diameter at a bending strain or a curvature of a prescribed range and a pitch (P) of a prescribed range. At this time, a principal surface 11a of the tape wire 11 is directed to the former 10. Thus, relatively loose bending is applied to the tape wire 11 along its longitudinal direction. When the bending strain is defined as follows, the tape wire 11 which is wound on the former 10 is bent at a bending strain of not more than 0.5 %, preferably not more than 0.3%. Superconductivity of the tape wire 11 is hardly deteriorated upon bending at a bending strain of such a range, as compared with that in a linear state.

bending strain (%)={thickness of tape-shaped superconducting wire/(bending diameter+thickness of the same)}× 100.

When a tape-shaped superconducting wire having a thickness t is spirally wound on a former having a diameter D at a pitch P, a bending strain $\epsilon$ is obtained in the following equation. According to the present invention, it is preferable to adjust the pitch P and the diameter D of the former so that the bending strain $\epsilon$ is not more than 0.3%.

$$\epsilon = t \times 100/(D_1+t)$$

$$D_1 = (P^2+(\pi D)^2)^{1/2}/\pi$$

According to the present invention, each tape-shaped multifilamentary oxide superconducting wire is preferably wound on the former with tension of not more than 2 kgf/mm$^2$ in a range of 0.5 to 2 kgf/mm$^2$, for example.

The core member (former) can be formed by either an electric insulating material or an electric conductor. The electric insulating material is preferable in consideration of reduction in ac loss, while a metal which is a conductor is preferable in consideration of strength. A metal pipe having a spiral groove or a metal bellows tube is a particularly preferable core member for providing the conductor with flexibility while maintaining constant strength. A metal core member can also be employed for feeding an abnormal current upon an accident. In this case, it is possible to set optimum resistivity of the core member in consideration of ac loss of the conductor and a burden of the core member for the abnormal current.

When the metal pipe having a spiral groove or the metal bellows tube is employed as the core member, the inventive conductor can further comprise a metal tape which is spirally wound on the core member, and an insulating tape which is spirally wound on a smooth surface formed by the metal tape. The metal tape can form a smooth surface for covering the grooves of the core member so that the superconducting tapes are not buckled by these grooves and for receiving the superconducting tapes. It is possible to cover the grooves while maintaining flexibility of the core member by winding the metal tape. The insulating tape which is wound on the metal tape cuts off electrical connection between the core member and the metal tape and the superconducting tapes. The insulating tape may be replaced by an electric insulating layer consisting essentially of another material. When the core member is prepared from a metal, this core member is preferably electrically insulated from the superconducting tapes.

According to the present invention, the electric insulating layer is at least provided between the layers, each of which is formed by a plurality of superconducting tapes. Further, it is possible to further insert an electric insulating layer between a plurality of side-by-side tape-shaped superconducting wires at least in any of the plurality of layers. When the core member consists essentially of a metal as described above, an electric insulating layer is preferably further inserted between the core member and the tape-shaped superconducting wires. Alternatively, a plurality of tape-shaped multifilamentary oxide superconducting wires which are previously covered with insulating layers may be wound on the core member. According to the present invention, the insulating layer suppresses electric connection between the superconducting tapes, thereby reducing ac loss of the conductor.

Figure 5:
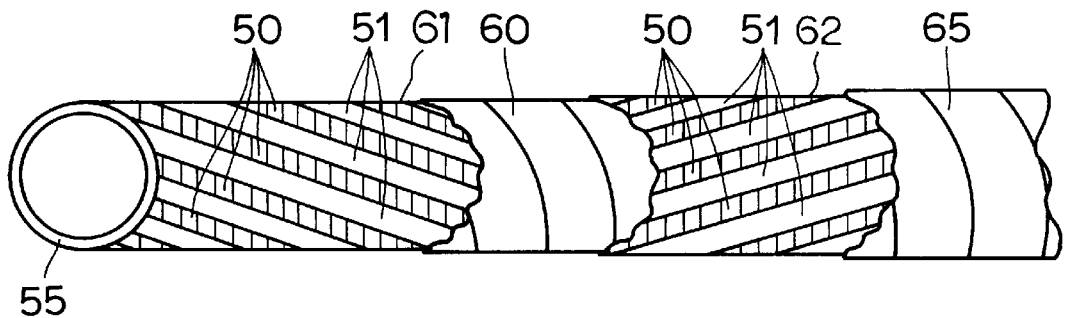
FIG. 5 is a perspective view typically showing a concrete example of a superconducting cable conductor according to the present invention.
Figure 6:
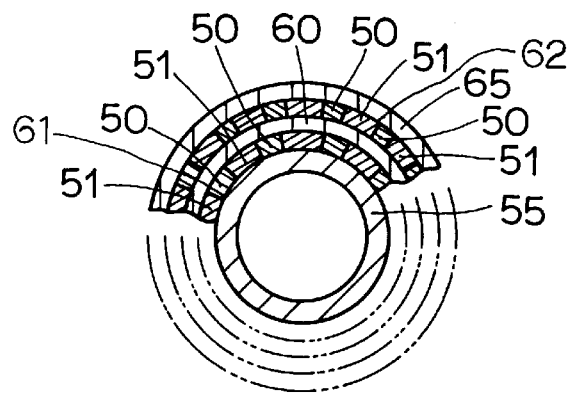
FIG. 6 is a sectional view showing a multilayer structure of strands and insulating materials in the conductor shown in FIG. 5.

FIGS. 5 and 6 typically illustrate insulation between layers and that between superconducting tapes in the layers. Insulating materials 50 are provided between superconducting strands 51 respectively. An interlayer insulating layer 60 is provided between first and second layers 61 and 62 which are formed by prescribed numbers of superconducting tapes, while the second layer 61 is further covered with an insulating layer 65. The insulating materials 50 are formed by cord-shaped or tape-shaped bodies which are spirally wound on a core member 55. The interlayer insulating layer 60 and the insulating layer 65 can be formed by wide tape-shaped or strip-shaped bodies. These materials are spirally wound on the strands 51.

According to the present invention, the materials excluding the core member are preferably formed by tape-shaped or cord-shaped bodies, in order to maintain flexibility of the core member and to provide the superconducting cable conductor with desired flexibility. Therefore, the electrical insulating layer is also preferably formed by a tape-shaped or cord-shaped body. In this case, it is possible to form the insulating layer by spirally winding an insulating tape or an insulating cord along the longitudinal direction of the core member. The insulating tape or cord can be wound with tension of 0.5 to 2 kgf/mm$^2$, for example.

Figure 7:
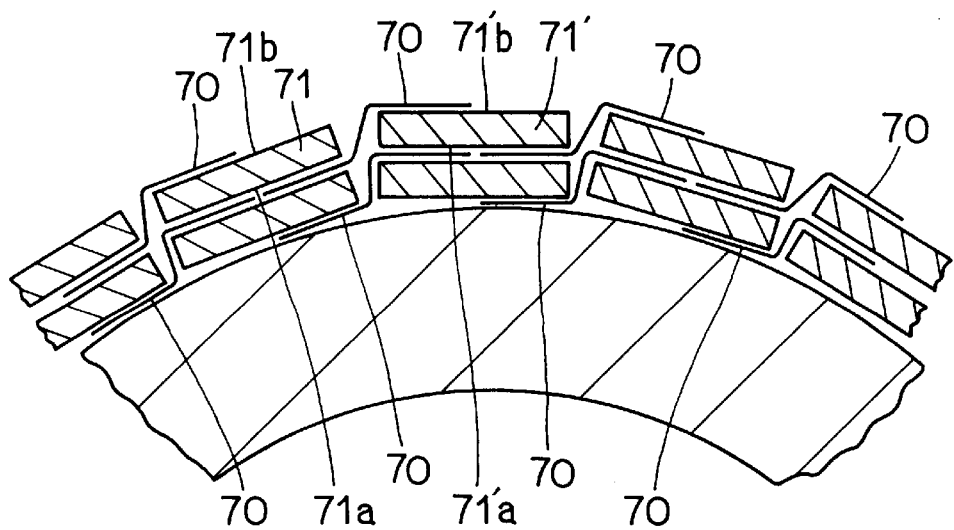
FIG. 7 is a sectional view showing a concrete example of such a structure that insulating tapes are held between adjacent tape-shaped oxide multifilamentary superconducting wires in the present invention.

In order to provide an electric insulating layer between a plurality of side-by-side superconducting tapes in each layer of the superconducting tapes, it is possible to employ superconducting tapes which are previously insulation-coated as a whole, for example. However, it is relatively difficult to sufficiently insulation-coat surfaces of flat tapes, particularly edge portions, and a high cost is required in this case. When superconducting tapes which are not coated in edge portions are lined up, electrical connection takes place therebetween. When an electric insulating layer is provided between side-by-side superconducting tapes in a layer, therefore, it is preferable to arrange an insulating tape as shown in FIG. 7. Referring to FIG. 7, each insulating tape 70 is held between adjacent superconducting tapes 71 and 71'. This insulating tape 70 is spirally wound along the superconducting tapes 71 and 71' to cover one major surface 71a of the superconducting tape 71 as well as one major surface 71'b of the superconducting tape 71'. In other words, the insulating tape 70 covers the major surface 71a of the superconducting tape 71 which is closer to the core member and the major surface 71'b of the other superconducting tape 71' which is opposite to the core member in pairs of opposite major surfaces (71a and 71b of the tape 71 and 71'a and 71'b of the tape 71') of the superconducting tapes 71 and 71' respectively. Due to this arrangement, one of the superconducting tapes is completely insulated from the other one, thereby solving the aforementioned problem on the edge portions. Further, it is also possible to insulate layers from each other by winding the insulating tape in the aforementioned manner.

The insulating layer can be prepared from an insulating material such as Kapton (polyimide based material), a polypropylene laminate paper (PPLP), polyethylene (PE) or a kraft paper, for example, while the insulating material preferably causes no deterioration such as cracking in liquid nitrogen. The insulating material is employed for forming an insulating layer in the form of a paper, a sheet, a film, fabric or a tape. The insulating layer is preferably not more than 0.1 mm in thickness, to allow compaction of the conductor. On the other hand, the insulating layer which is previously formed on each superconducting tape preferably consists essentially of enamel, for example.

Figure 8:
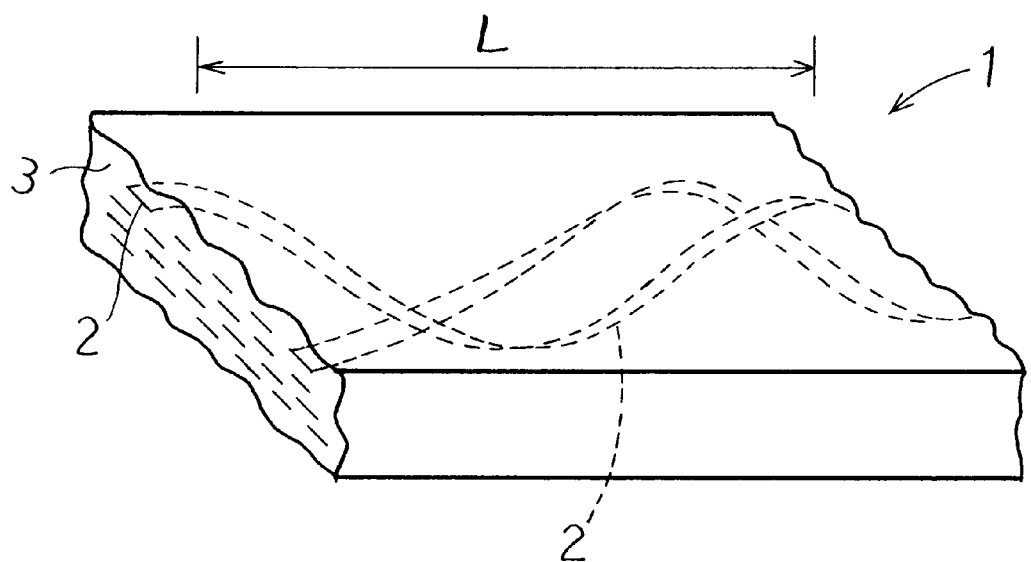
FIG. 8 is a perspective view showing states of filaments twisted in a multifilamentary oxide superconducting wire.

According to the present invention, it is possible to employ tape-shaped multifilamentary wires each having twisted filaments. FIG. 8 typically shows such a superconducting wire. Referring to FIG. 8, filaments 2 forming a superconducting multifilamentary tape 1 are twisted at a prescribed pitch L, for example. Due to such twisting of the filaments 2, an induction current flowing between a stabilizing metal 3 and the filaments 2 is parted every twisting pitch L into small loops, and hence the value of the current is limited. Thus, generation of Joule heat is suppressed in the stabilizing metal 3 and ac loss is reduced as compared with a superconducting wire having untwisted filaments. It is possible to prepare a multifilamentary wire having such twisted filaments in the following manner, for example: First, a plurality of single-filamentary wires each having a filament of an oxide superconductor are engaged in a metal pipe, and this metal pipe is drawn into a wire. Then, the wire is twisted in a state of a round wire, for forming twisted filaments. Then, the wire is again drawn and thereafter rolled and heat treated. Through such steps, the filaments are changed in diameter and thickness by drawing, rolling etc. while maintaining twisted shapes. In the twisting, drawing and rolling steps, the twisting pitch is preferably set at a level of more than five times or preferably ten times as large as the diameter of the wire to be twisted, so that the wire is not parted.

The superconducting cable conductor according to the present invention has such flexibility that its superconductivity is substantially not deteriorated also when the same is bent up to 1.5 m, preferably up to 2.6 m, in bending diameter. This conductor can be wound on a drum, to be stored and carried.

According to the present invention, it is possible to provide a long oxide superconducting cable conductor having flexibility as well as excellent superconductivity. In the present invention, an eddy current or a coupling current transferred between and flowing across the superconducting tapes is suppressed by the insulating layer which is effectively provided according to the present invention. It is possible to reduce ac loss of the conductor by at least one digit, due to the insulating layer. The present invention provides a further practical ac superconducting cable conductor.

The present invention is now further concretely described.

Study on Bending Strain of Superconducting Tape wound on Former

Oxides or carbonates were mixed with each other to contain Bi, Pb, Sr, Ca and Cu in composition ratios of 1.84:0.36:1.99:2.18:3.00. This mixed powder was heat treated to obtain powder containing 85% of a 2212 phase and 15% of a 2223 phase as superconducting phases while mainly containing $(Ca,Sr)_2PbO_4$ and $Ca_2CuO_3$ as non-superconducting phases. The powder as treated was charged in a silver pipe of 12 mm in outer diameter and 9 mm in inner diameter, and the silver pipe was drawn into 1.3 mm in diameter. A prescribed number of strands obtained in the aforementioned manner were charged in a silver pipe of prescribed sizes, and the silver pipe was drawn into 1.0 mm in diameter. The wire as obtained was rolled into 0.3 mm in thickness. This wire was heat treated at 845° C. for 55 hours, and thereafter rolled at a draft of 15%. The tape wire as obtained was heat treated at 838° C. for 48 hours. Through the aforementioned process, six types of tape-shaped superconducting wires were obtained as shown in Table 1. Critical current densities (Jc) of these tape wires were measured under liquid nitrogen along proper lengths. The critical current densities Jc were measured when the tape wires were in linear states and bent in prescribed diameters respectively. Table 2 shows results of the critical current densities Jc which were measured with respect to five bending strains. As understood from Tables 1 and 2, reduction in critical current density Jc of the wire to which bending strain is applied is reduced as the thickness percentage of the superconductor with respect to the thickness of the wire is reduced. The percentage is preferably not more than 10%. On the other hand, each wire preferably has at least 37 filaments. In a superconducting tape having at least 61 filaments, the critical current density Jc is not much reduced by bending 0.5%. It is understood possible to hold multifilamentary superconducting wires prepared along the aforementioned process at a bending strain of not more than 0.5%, preferably not more than 0.3% in practice.

TABLE 1

| Number of Charged Strands | Size of Silver Pipe | | $\dfrac{\text{Thickness of Superconductor}}{\text{Thickness of Wire}} \times 100(\%)$ |
|---|---|---|---|
| | Outer Diameter | Inner Diameter | |
| 1 | 169 | 26 | 19.5 | 4.0 |
| 2 | 91 | 19 | 14.3 | 5.4 |
| 3 | 61 | 15.6 | 11.7 | 6.6 |
| 4 | 37 | 12 | 9.0 | 8.6 |
| 5 | 19 | 8.7 | 6.5 | 12 |
| 6 | 7 | 5.2 | 3.9 | 20 |

TABLE 2

| | 255 mm φ | | 128 mm φ | | 85 mm φ | | 64 mm φ | | 25 mm φ | |
|---|---|---|---|---|---|---|---|---|---|---|
| | A | B | A | B | A | B | A | B | A | B |
| 1 | 0.1 | 1.50 (100) | 0.2 | 1.50 (100) | 0.3 | 1.50 (100) | 0.4 | 1.50 (100) | 0.5 | 1.50 (100) |
| 2 | 0.1 | 1.70 (100) | 0.2 | 1.70 (100) | 0.3 | 1.70 (100) | 0.4 | 1.70 (100) | 0.5 | 1.70 (100) |
| 3 | 0.1 | 1.90 (100) | 0.2 | 1.90 (100) | 0.3 | 1.84 (97) | 0.4 | 1.82 (96) | 0.5 | 1.79 (94) |
| 4 | 0.1 | 2.0 (100) | 0.2 | 1.92 (96) | 0.3 | 1.84 (92) | 0.4 | 1.80 (90) | 0.5 | 1.76 (88) |
| 5 | 0.1 | 2.1 (100) | 0.2 | 1.95 (93) | 0.3 | 1.83 (87) | 0.4 | 1.74 (83) | 0.5 | 1.63 (78) |
| 6 | 0.1 | 2.2 (100) | 0.2 | 2.00 (93) | 0.3 | 1.83 (83) | 0.4 | 1.72 (78) | 0.5 | 1.63 (74) |

A: bending strain (%)
B: Jc ($\times 10^4$ A/m$^2$)
*Parenthesized numerals indicate percentages of critical current densities Jc after bending with respect to those before bending.

Measurement of ac Loss $Bi_2O_3$, PbO, $SrCO_3$, $CaCO_3$ and CuO were blended with each other to contain Bi, Pb, Sr, Ca and Cu in composition ratios of 1.81:0.40:1.98:2.21:3.03. The blended powder was heat treated a plurality of times, with crushing after every heat treatment Powder obtained through such heat treatment and crushing was further crushed by a ball mill, to obtain submicron powder. This powder was heat treated at 800° C. for 2 hours, and charged in a silver pipe of 12 mm in outer diameter and 9 mm in inner diameter.

The silver pipe charged with the powder was drawn and cut into a plurality of wires, which were thereafter engaged in another silver pipe of 12 mm in outer diameter and 9 mm in inner diameter, to prepare a multifilamentary wire having 61 filaments. This multifilamentary wire was further drawn, rolled into 3.0 mm in width and 0.22 mm in thickness, and then heat treated. Thereafter the wire was further rolled into 0.20 mm in thickness and heat treated, thereby obtaining a silver-coated bismuth oxide superconducting wire having 61 filaments.

Figure 9:
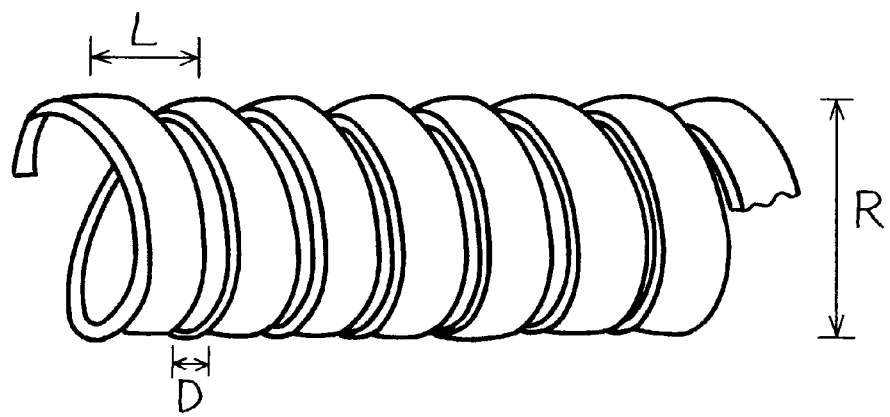
FIG. 9 is a perspective view showing another shape of a core member.

Then, a steel tape of 0.33 mm in thickness and 10 mm in width was spirally wound into a former having an outer diameter R of 19 mmφ, a winding pitch L of 4 mm and a gap D of 2 mm, as shown in FIG. 9.

Figure 10A:
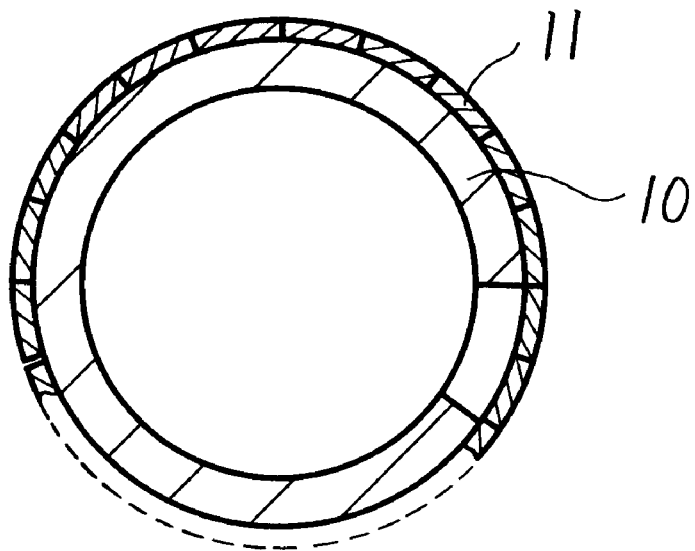
FIGS. 10(a) and 10(b) are sectional views showing a process of winding superconducting multifilamentary wires on a core member with no interposition of an insulating layer.
Figure 10B:
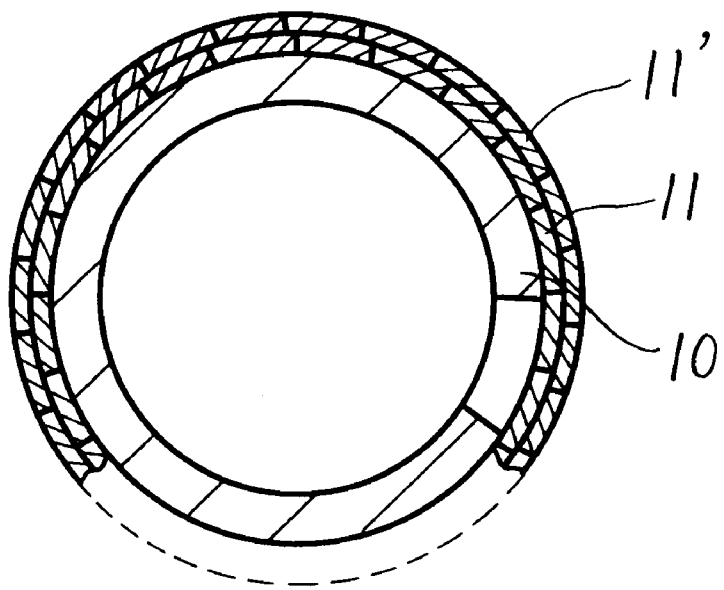

20 tape-shaped multifilamentary superconducting wires obtained in the aforementioned manner were spirally wound on the former in a side-by-side manner at a winding pitch of 250 mm. FIG. 10(*a*) is a sectional view showing a single-layer conductor as obtained. Referring to FIG. 10(*a*), superconducting multifilamentary wires 11 are wound on a former 10 in a side-by-side manner. The single-layer conductor as obtained exhibited a critical current value (Ic) of 550 A.

Then, 22 superconducting multifilamentary wires were spirally wound on the single-layer conductor in a side-by-side manner at a winding pitch of 250 mm, in a direction opposite to the winding direction for the first layer. FIG. 10(*b*) is a sectional view showing a two-layer conductor thus obtained. Superconducting multifilamentary wires 11' are further wound on the superconducting wires 11 wound on the former 10. The two-layer conductor as obtained exhibited a critical current Ic of 850 A.

Figure 11:
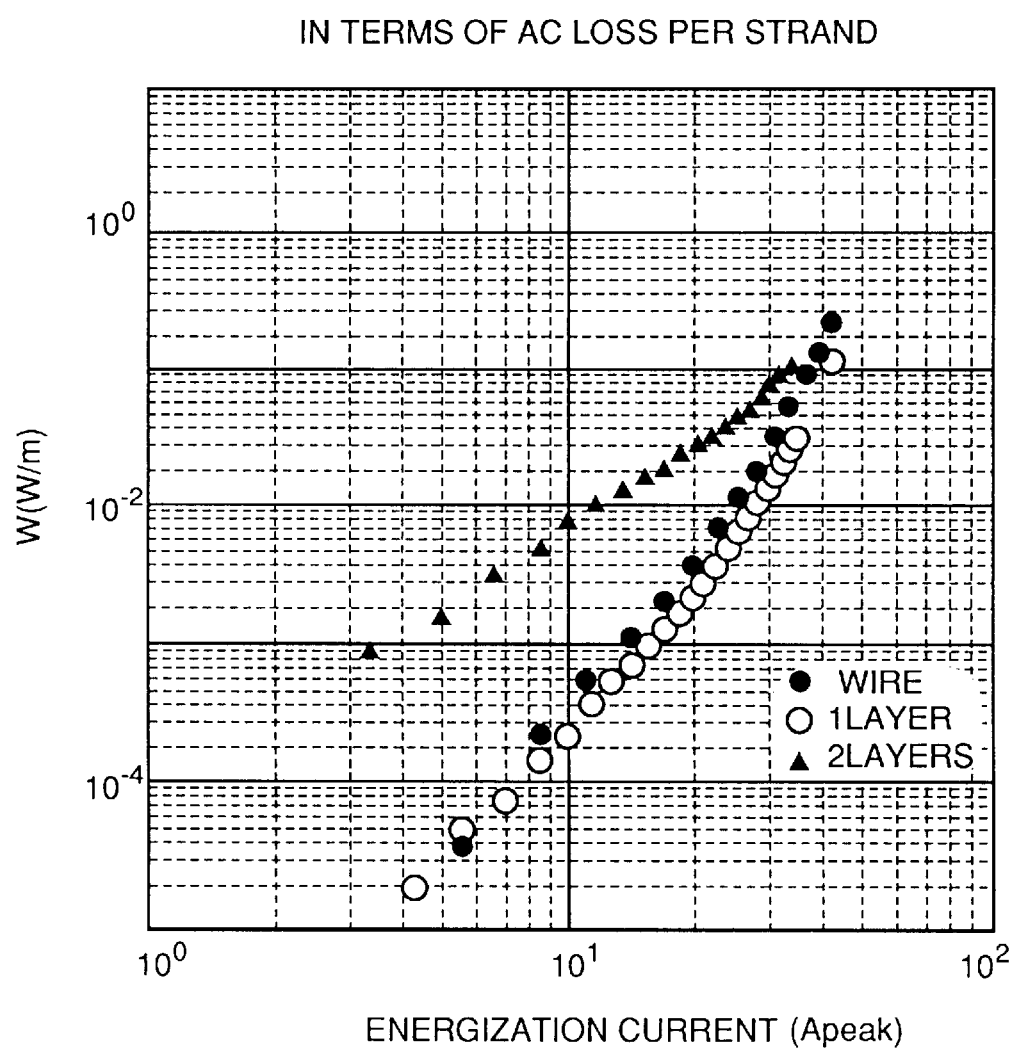
FIG. 11 illustrates relations between ac loss values per strand and energization currents in conductors obtained by stacking superconducting multifilamentary wires.

In this conductor, ac loss values were measured in states of the single-layer conductor having 20 strands and the two-layer conductor having 42 strands. FIG. 11 illustrates relations between ac loss values per strand and energization currents in the respective cases. FIG. 11 also illustrates a relation between ac loss and an energization current in each strand having a critical current Ic of 20 A, which was measured before preparation of the conductor. Referring to FIG. 11, black circles, white circles and black triangles show values related to each strand, the single-layer conductor and the two-layer conductor respectively. As shown in FIG. 11, the single-layer conductor exhibited ac characteristics which were substantially identical to those of the unassembled strand. In the two-layer conductor, on the other hand, ac loss per strand was increased as compared with that of the independent strand. Through this experiment, it has been proved that a single-layer conductor has lower ac loss than a multilayer conductor. It has been forecasted that this results from generation of an eddy current or a coupling current transferred and flowing across the layers, which is not present in the single-layer conductor. In order to verify this hypothesis, superconductors provided with insulating materials between layers for cutting off electrical conductivity were prepared thereby reducing ac loss in multilayer conductors.

EXAMPLE 1

20 multifilamentary wires obtained in the aforementioned manner were wound on a spiral tube former of 19 mmφ in outer diameter and 0.3 mm in thickness with gaps of 2 mm at a pitch of 4 mm shown in FIG. 1, in a side-by-side manner. The wires were wound at a pitch of 250 mm. Then, an insulating material prepared from a PPLP paper of 140 µm in thickness and 30 mm in width was spirally wound on the multifilamentary wires by one layer at a pitch of 40 mm with gaps of 0.5 mm. Then, 22 strands identical to the above were spirally wound thereon at a pitch of 250 mm, in a direction opposite to that for the first wires.

Figure 12:
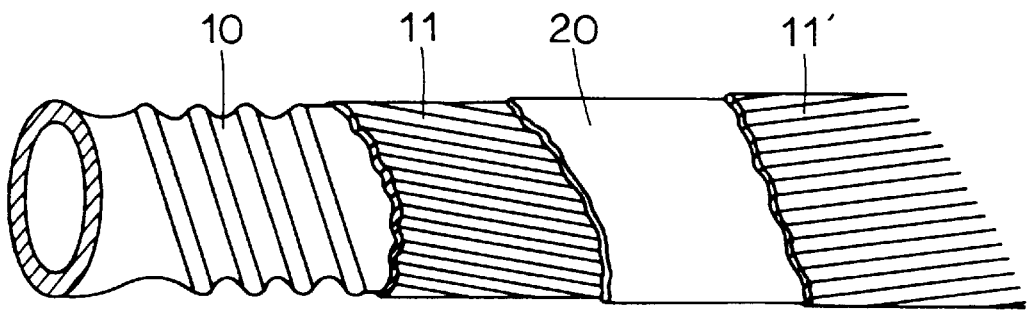
FIG. 12 is a perspective view showing another example of the inventive conductor.
Figure 13:
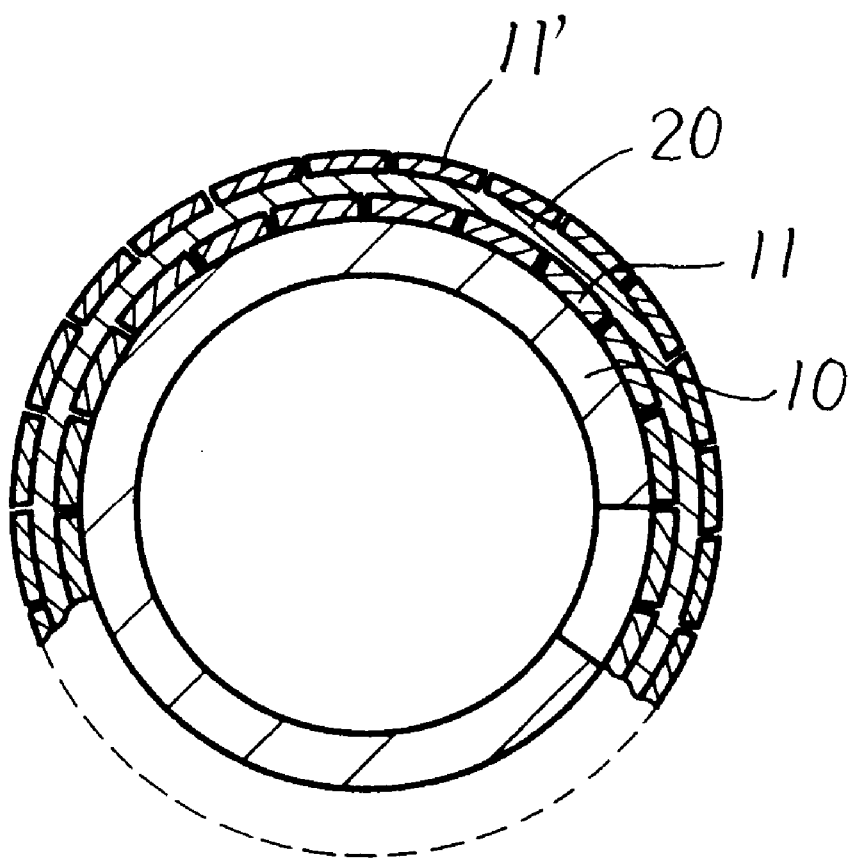
FIG. 13 is a sectional view of the conductor shown in FIG. 12.

FIGS. 12 and 13 show the conductor as obtained. In the two-layer conductor as obtained, superconducting multifilamentary wires 11 are wound on a former 10 in a side-by-side manner to form a first layer, as shown in FIGS. 12 and 13. An insulating layer 20 of a PPLP paper is provided on the superconducting multifilamentary wires 11, while superconducting multifilamentary wires 11' are wound thereon in a side-by-side manner to form a second layer. The conductor as obtained exhibited a critical current Ic of 850 A. In this conductor, ac loss was reduced by about one digit as compared with that of a two-layer conductor which was manufactured with no insulating layer. In terms of ac loss per strand, the ac loss of the conductor approached that of an independent unassembled strand. Through the aforementioned experiment, it has been proved effective to provide an insulating layer between layers of a multilayer conductor, for reducing its ac loss.

Figure 14:
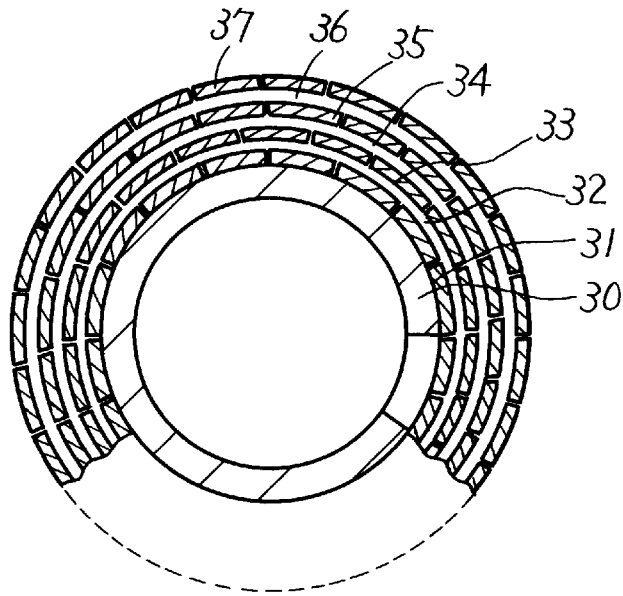
FIG. 14 is a sectional view showing still another example of the inventive conductor.

While the above Example has been described with reference to a two-layer conductor, it is possible to attain the effect of the insulating layer similarly to the above also as to superconducting multifilamentary wires which are superposed with each other in three or more layers. As shown in FIG. 14, for example, it is possible to provide a compact conductor which can reduce ac loss and supply a heavy current by a structure obtained by successively stacking a first layer of superconducting multifilamentary wires 31, an insulating layer 32, a second layer of superconducting multifilamentary wires 33, an insulating layer 34, a third layer of superconducting multifilamentary wires 35, an insulating layer 36, and a fourth layer of superconducting multifilamentary wires 37.

Figure 15A:
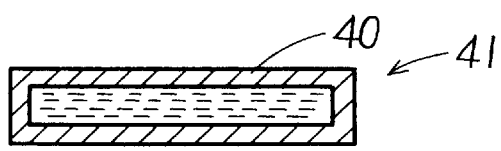
FIGS. 15(a) and 15(b) are sectional views showing a superconducting multifilamentary wire covered with an insulating layer, and a further example of the inventive conductor manufactured through superconducting multifilamentary wires covered with insulating layers respectively.
Figure 15B:
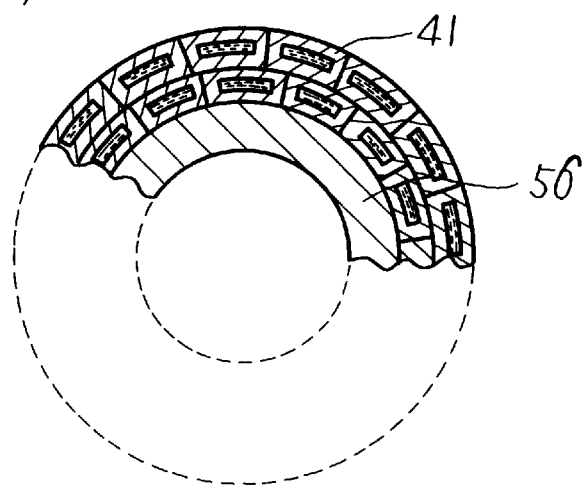

It is also possible to cover surfaces of superconducting multifilamentary wires with insulating layers, for winding the wires on a former. For example, a superconducting multifilamentary wire 41 is covered with an insulating layer 40, as shown in FIG. 15(*a*). It is possible to wind a plurality of such superconducting multifilamentary wires 41 on a former 56, as shown in FIG. 15(*b*). While this structure conceivably requires a long time for insulation coating and a higher cost as compared with the case of inserting the insulating material between the layers, insulation is more reliably performed in this case.

EXAMPLE 2

$Bi_2O_3$, PbO, $SrCO_3$, $CaCO_3$ and CuO were blended with each other to contain Bi, Pb, Sr, Ca and Cu in composition ratios of 1.81:0.30:1.92:2.01:3.03. The blended powder was heat treated a plurality of times, with crushing after every heat treatment. Powder obtained through such heat treatment and crushing was further crushed by a ball mill, to obtain submicron powder. This powder was heat treated at 800° C. for 2 hours, and thereafter charged in a silver pipe of 12 mm in outer diameter and 9 mm in inner diameter. The silver pipe charged with the powder was drawn and cut into a plurality of wires, which were thereafter engaged in another silver pipe of 12 mm in outer diameter and 9 mm in inner diameter, to prepare a multifilamentary wire having 61 filaments. This wire was further drawn, then rolled into 3.0 mm in width and 0.22 mm in thickness, and heat treated. Thereafter the wire was further rolled into 0.20 mm in thickness and heat treated, thereby obtaining a silver-coated bismuth oxide superconducting wire having 61 filaments. The wire was sintered and cut into samples of 1 m in length, which were subjected to measurement of critical direct currents. It was confirmed that the 100 samples exhibited stable critical currents of 23±1 A.

The following conductors were manufactured through the wires of 1 m in length, and subjected to investigation of ac characteristics. Superconducting wires each having 61 filaments were spirally wound on FRP formers of 1 m in length and 19 mm$\phi$ in outer diameter in a side-by-side manner, to prepare two types of single-layer conductors A and B respectively. The superconducting wires were wound at pitches of 250 mm. In the conductor A, 20 wires were densely assembled with each other with no insulating material arranged therebetween. In the conductor B, on the other hand, 17 superconducting wires were assembled with each other with interposition of a cord-shaped insulator of 0.5 mm$\phi$, which was prepared by stranding kraft papers for serving as a spacer, and spirally wound.

As to the conductors, ac loss values were measured in liquid nitrogen of about 77 K in temperature by an energization method, and each ac loss value was defined by the product of the energization current and a voltage component which was in phase with the current. Each of the energization current and the loss value was divided by the number of the strands as employed, to calculate ac loss per strand. It has been confirmed that ac loss of the conductor A was about twice that of the conductor B in such a region that a current flowing every strand was not more than 23 Ap. Through this experiment, it has been confirmed effective to electrically insulate multifilamentary superconducting wires forming the same layer from each other, for reducing ac loss.

EXAMPLE 3

Wires of 1 m in length, which were identical to those in Example 2, were employed to prepare a conductor, for investigating its ac characteristics.

Multifilamentary superconducting wires were spirally wound on a copper former of 1 m in length and 19 mm$\phi$ in outer diameter in a side-by-side manner, to prepare a single-layer conductor C. The wires were wound at a pitch of 250 mm. 20 wires were densely assembled with each other, with no arrangement of an insulating material therebetween. As to this conductor C, ac loss was measured in liquid nitrogen. Ac loss per strand was obtained similarly to Example 2, to confirm that the ac loss of the conductor C was twice to five times that of the conductor B in such a region that an energization current to the strands was not more than 23 Ap. Through this experiment, it has been confirmed that ac loss of a conductor is increased when its core member is prepared from a metal and superconducting wires are in contact with the core member.

EXAMPLE 4

Wires of 1 m in length, which were identical to those in Example 2, were employed to prepare conductors, for investigating ac characteristics.

Multifilamentary superconducting wires were wound on aluminum spiral pipes, having shapes similar to that shown in FIG. 1, of 1 m in length and 28 mm$\phi$ in outer diameter, in a side-by-side manner, to prepare two types of single-layer conductors D and E respectively. The wires were wound at pitches of 250 mm. 20 wires were assembled on each spiral pipe, with arrangement of a kraft paper of 1 mm in width and 0.1 mm in thickness between the strands. In the conductor D, a copper tape was spirally wound on the aluminum pipe so that the multifilamentary superconducting wires were spirally wound thereon in one layer. In the other conductor E, a copper tape was spirally wound on the aluminum pipe, and a Lumirror tape (polyester based tape) of 0.1 mm in thickness was further spirally wound thereon for electrical insulation. The multifilamentary superconducting wires were spirally wound on this insulating tape in one layer.

As to each of the conductors D and E, ac loss per strand in the conductor was measured in liquid nitrogen, to confirm that the ac loss of the conductor D was five to ten times that of the conductor E in a region of not more than 23 Ap. Through this experiment, it has been confirmed possible to suppress increase of ac loss by arranging an insulating material on a surface of a core member for assembling superconducting wires thereon when the core member is prepared from a metal.

EXAMPLE 5

$Bi_2O_3$, PbO, $SrCO_3$, $CaCO_3$ and CuO were blended with each other to contain Bi, Pb, Sr, Ca and Cu in composition ratios of 1.81:0.30:1.92:2.01:3.03. The blended powder was heat treated a plurality of times, with crushing after every heat treatment. Powder obtained through such heat treatment and crushing was further crushed by a ball mill, to obtain submicron powder. This powder was heat treated at 800° C. for 2 hours, and charged in a silver pipe of 12 mm in outer diameter and 9 mm in inner diameter. After the silver pipe charged with the powder was drawn, a plurality of wires were engaged in another silver pipe of 12 mm in outer diameter and 9 mm in inner diameter, to prepare a multifilamentary wire having 61 filaments. This wire was further rolled into 3.0 mm in width and 0.22 mm in thickness, and heat treated. Thereafter the wire was further rolled into 0.20 mm in thickness and heat treated, thereby obtaining a silver-coated bismuth oxide superconducting wire having 61 filaments. The wire was sintered and cut into 200 samples of 1 m in length, which were subjected to measurement of critical direct currents. It was confirmed that the 200 samples exhibited stable critical currents of 23±2 A.

The wires of 1 m in length as obtained were employed to prepare conductors, for investigation of ac characteristics. The multifilamentary superconducting wires were spirally wound on FRP formers of 1 m in length and 19 mm$\phi$ in outer diameter in a side-by-side manner in double layers, to prepare five types of two-layer conductors F, G, H, I and J. The wires were wound at pitches of 500 mm.

In the first conductor F, no insulating material was arranged between adjacent multifilamentary superconducting which were assembled on the former, in the first or second layer. Further, no insulating material was arranged between the first and second layers either. 40 wires were densely wound on the former in two layers.

In the second conductor G, no insulating material was arranged between the wires forming the first or second layer. On the other hand, a PPLP paper of 30 mm in width and 0.17 mm in thickness was spirally wound between the first and second layers, to insulate these layers from each other. 40 multifilamentary superconducting wires were wound on the former, to form two layers.

In the third conductor H, Kapton tapes (polyimide based tape) of 0.5 mm in width and 0.2 mm in thickness were inserted between the multifilamentary superconducting layers as spacers, for forming first and second layers. Further, a spirally wound Kapton tape of 30 mm in width and 0.2 mm in thickness was arranged between the first and second layers.

In the fourth conductor I, a Lumirror tape (polyester based tape) of 5 mm in width and 0.02 mm in thickness was held between adjacent multifilamentary wires in the first or second layer. This Lumirror tape was held between the adjacent superconducting wires as shown in FIG. 7. In other words, the Lumirror tape was spirally wound along superconducting tapes to cover an upper portion of one of the adjacent superconducting tapes while covering a lower portion of the other superconducting tape. Thus, it was possible to insulate the first and second layers from each other with no interposition of an insulating tape therebetween.

In the fifth conductor J, multifilamentary superconducting wires which were previously covered with enamel were assembled with each other, while holding Kapton tapes of 3 mm in width and 0.02 mm in thickness between adjacent superconducting wires in the first and second layers respectively. The insulating tapes were arranged between the superconducting wires similarly to those in the conductor I.

Ac loss was measured as to each of the conductors F to J in liquid nitrogen of about 77 K in temperature by an energization method. The ac loss was defined by the product of the energization current and a voltage which was in phase with the current. Each of the energization current and the loss value was divided by the number of the strands as employed, to calculate ac loss in terms of that per strand. When currents of 20 Ap per strand were fed, the conductors F, G, H, I and J exhibited ac loss values of 7 mW/m, 1 mW/m, 0.7 mW/m, 0.7 mW/m and 0.7 mW/m respectively. As to regions of not more than 25 Ap, the conductors F and G exhibited the maximum and next loss values respectively. In the conductors H, I and J, on the other hand, the ac loss values remained substantially at the same levels in overall regions, thereby implementing reduction of ac loss. Thus, it has been confirmed effective to electrically insulate strands from each other between layers and in the same layer. In more concrete terms, the structures of the conductors H, I and J are further effective.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An ac superconducting cable conductor employing an oxide superconductor, comprising:

a flexible long core member;

a plurality of tape-shaped multifilamentary oxide superconducting wires being spirally wound on said core member with tension of not more than 2 kgf/mm$^2$ and at a bending strain of not more than 0.3% and an electric insulating layer, each said tape-shaped multifilamentary superconducting wire including a plurality of filaments consisting essentially of an oxide superconductor, and a stabilizing metal covering the same, said plurality of tape-shaped superconducting wires forming a plurality of layers each being formed by winding a plurality of said tape-shaped superconducting wires in a side-by-side manner, said plurality of layers being successively stacked on said core member, said insulating layer being at least provided between said plurality of layers, said core member providing said superconducting cable conductor with flexibility, said superconducting cable conductor capable of maintaining a superconducting state at the liquid nitrogen temperature, said filaments having substantially homogeneous superconducting phases along the longitudinal direction of said tape wire, c-axes of said superconducting phases being oriented substantially in parallel with the direction of thickness of said wire, said filaments being formed by crystal grains in the form of flakes extending along the longitudinal direction of said tape wire, said flaky crystal grains being stacked along the direction of thickness of said tape wire.

2. A superconducting cable conductor in accordance with claim 1, having a flexibility such that the superconductivity of said superconducting cable is not substantially deteriorated upon bending up to 1.5 m in bending diameter.

3. A superconducting cable conductor in accordance with claim 1, further comprising an electric insulating layer between said plurality of tape-shaped superconducting wires being lined up at least in any of said plurality of layers.

4. A superconducting cable conductor in accordance with claim 1, wherein said core member consists essentially of a metal, said superconducting cable conductor further comprising an electric insulating layer between said core member and said layer.

5. A superconducting cable conductor in accordance with claim 1, wherein each said electric insulating layer is formed by spirally winding an insulating tape along the longitudinal direction of said core member.

6. A superconducting cable conductor in accordance with claim 3, wherein each said electric insulating layer is formed by an insulating tape, said insulating tape being held between adjacent said tape-shaped superconducting wires being lined up in at least any of said plurality of layers and spirally wound along said adjacent superconducting wires for covering a core member side major surface of one of said adjacent superconducting wires and one major surface of the other said superconducting wire being opposite to said core member in pairs of opposite major surfaces of respective said wires.

7. A superconducting cable conductor in accordance with claim 1, wherein a plurality of tape-shaped multifilamentary oxide superconducting wires being previously covered with insulating layers are wound on said core member.

8. A superconducting cable conductor in accordance with claim 1, wherein said core member is a metal pipe having a spiral groove or a metal bellows tube.

9. A superconducting cable conductor in accordance with claim 8, further comprising a metal tape being spirally wound on said core member and an insulating tape being spirally wound on a smooth surface being formed by said metal tape, said tape-shaped multifilamentary oxide superconducting wires being spirally wound on said insulating tape.

10. A superconducting cable conductor in accordance with claim 1, wherein said filaments are twisted in said tape-shaped multifilamentary oxide superconducting wires.

* * * * *